United States Patent
Aratake et al.

(10) Patent No.: US 6,686,219 B2
(45) Date of Patent: Feb. 3, 2004

(54) METHOD OF FABRICATING PIEZOELECTRIC VIBRATOR

(75) Inventors: Kiyoshi Aratake, Chiba (JP); Masayoshi Shiraishi, Chiba (JP)

(73) Assignee: Seiko Instruments Inc., Chiba (JP)

( * ) Notice: Subject to any disclaimer, the term of this patent is extended or adjusted under 35 U.S.C. 154(b) by 5 days.

(21) Appl. No.: 10/205,914

(22) Filed: Jul. 26, 2002

(65) Prior Publication Data

US 2002/0185939 A1 Dec. 12, 2002

Related U.S. Application Data

(62) Division of application No. 09/771,066, filed on Jan. 26, 2001, now Pat. No. 6,504,290.

(30) Foreign Application Priority Data

Feb. 17, 2000 (JP) .......................................... 2000-40031

(51) Int. Cl.[7] .......................... H01L 21/00; H04R 17/00
(52) U.S. Cl. .......................... 438/50; 29/25.35; 438/51; 438/52; 438/53
(58) Field of Search .............................. 438/50, 51, 52, 438/53, 460; 29/25.35; 310/328, 361, 366, 370

(56) References Cited

U.S. PATENT DOCUMENTS

| 4,176,030 A | * | 11/1979 | Negita ................... 204/192.15 |
| 4,421,621 A | * | 12/1983 | Fujii et al. ............. 204/192.12 |
| 6,391,672 B2 | * | 5/2002 | Namerikawa et al. ........ 438/50 |
| 6,606,772 B1 | * | 8/2003 | Nohara et al. ............. 29/25.35 |

* cited by examiner

*Primary Examiner*—David Nelms
*Assistant Examiner*—Long Tran
(74) *Attorney, Agent, or Firm*—Adams & Wilks

(57) ABSTRACT

A method of fabricating a piezoelectric vibrator comprises providing a piezoelectric oscillating plate having a piezoelectric vibrator piece and frame integrally connected to a base end portion of the piezoelectric vibrator piece and surrounding the piezoelectric vibrator piece. A pair of excitation electrodes is disposed on surfaces of two sides of the piezoelectric vibrator piece for vibrating the piezoelectric vibrator piece. Bond films are formed on upper and lower surfaces of the frame and are connected to the excitation electrodes. Shortcircuiting electrodes are disposed on the piezoelectric oscillating plate for causing a shortcircuit to electrically connect the bond films to each other. The piezoelectric vibrator piece is covered to seal the piezoelectric vibrator piece in an airtight manner via the bond films without hampering vibration of the piezoelectric vibrator piece.

12 Claims, 5 Drawing Sheets

METHOD OF FABRICATING PIEZOELECTRIC VIBRATOR

This application is a division of application Ser. No. 09/771,066 filed Jan. 26, 2001, now U.S. Pat. No. 6,504,290.

BACKGROUND OF THE INVENTION

1. Field of the Invention

The present invention relates to an electrode structure of and a method of fabricating a piezoelectric vibrator for a portable telephone and a portable information terminal.

2. Description of Related Art

As a piezoelectric vibrator of a related art, there is provided a structure in which, for example, upper and lower face of a vibrator comprising a piezoelectric vibrator piece and an upper portion of frame integrally formed at a base end portion of the piezoelectric vibrator piece, are provided with a pair of a lid and a base having recess portions having spaces to a degree of not hampering vibration of the piezoelectric vibrator piece.

When a plurality of respective members of piezoelectric vibrators as describe above are formed on a wafer having a large area and mass-produced by a unit of the wafer, according to an electrode pattern such as an excitation electrode film formed on an individual vibration piece, in order to grasp electric properties by individually exciting the vibration piece, it is necessary to arrange independently each of electrode patterns.

According to such a structure, when there is adopted a method of bonding the respective members under high temperature and applying voltage by interposing a bond film as in anode bonding, by feeding electricity respectively to a plurality of the electrode patterns provided to a face of the wafer opposed to a side of a lid formed with a plurality of the vibrators, electricity is fed to the bond film of the wafer formed with the base and the vibrators and the bases are bonded earlier. Successively, extension electrodes to outer electrodes are formed at the wafer formed with the bases, electricity is fed to the respective extension electrodes, electricity is fed to the bond films on the side of the lids and the lids and vibrators are bonded.

However, according to the above-described method, when the lids and the bases are formed at a wafer having a material with thermal expansion different from that of the wafer formed with the vibrators, at a time point of bonding the wafer formed with the vibrators and the bases, by a difference in the thermal expansion coefficient of the wafer formed with the vibrators and the bases, warp is caused and therefore, a large area thereof enlarging a warp amount can not be bonded.

SUMMARY OF THE INVENTION

In view of the foregoing drawbacks in the conventional art, it is an object of the invention to provide a method of fabricating a piezoelectric vibrator having an electrode structure which prevents the occurrence of warp in a bonding operation and which is capable of bonding a large area with high productivity.

According to an aspect of the invention resolving the above-described problem, when there is fabricated, in a unit of wafer, a piezoelectric vibrator having a structure including a pair of a lid and a base having recess portions having spaces to a degree of not hampering vibration of a piezoelectric vibrator piece on upper and lower faces of an vibrator comprising the piezoelectric vibrator piece and a frame-like portion integrally connected to a base end portion of the piezoelectric vibrator piece and surrounding the piezoelectric vibrator piece, there is provided an electrode structure of the piezoelectric vibrator characterized in that a plurality of the vibrators each comprising the piezoelectric vibrator piece and the frame-like portion are formed on the wafer, a plurality of electrode patterns each comprising a pair of excitation electrodes formed on the piezoelectric vibrator piece and bond films on the frame-like portion connected to the excitation electrodes and respectively formed independently from each other, are added with sputter films for shortcircuiting capable of being bonded to lids for shortcircuiting respectives thereof and the plurality of electrode patterns are connected to each other. By forming the sputter films for shortcircuiting and connecting all of the respective electrode patterns, electricity can be supplied simultaneously to the bond films on two faces of the substrate. Thereby, according to the invention, three sheets of wafers can be bonded simultaneously, occurrence of warp after bonding can be prevented and a large area can be bonded.

DETAILED DESCRIPTION OF THE PREFERRED EMBODIMENT

A detailed explanation will be given of the invention in reference to the drawings as follows.

Figure 1:
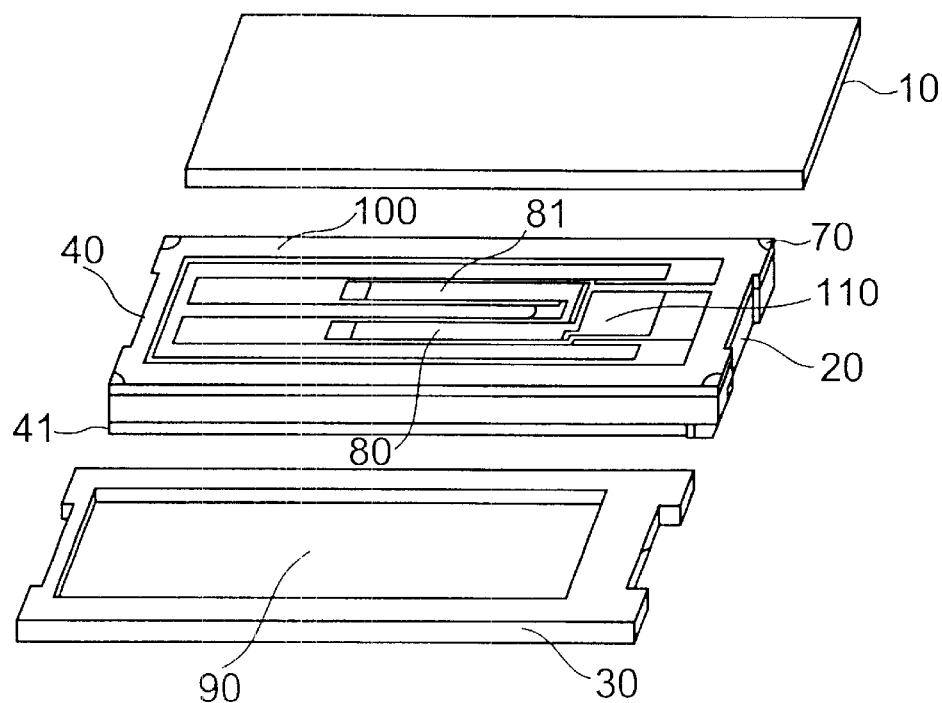
FIG. 1 is a disassembled perspective view of a piezoelectric vibrator according to an embodiment of the invention.
Figure 2:
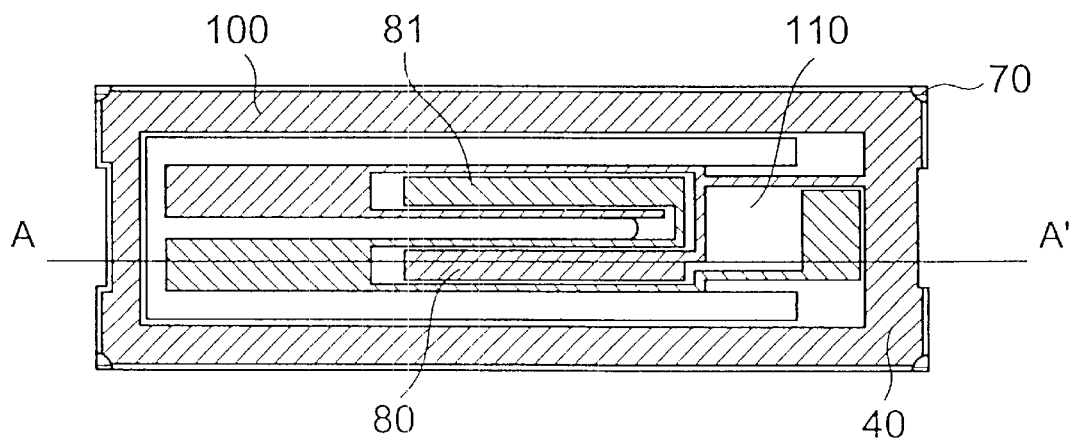
FIG. 2 is a top view of a vibrator 20 according to the embodiment of the invention.
Figure 3:
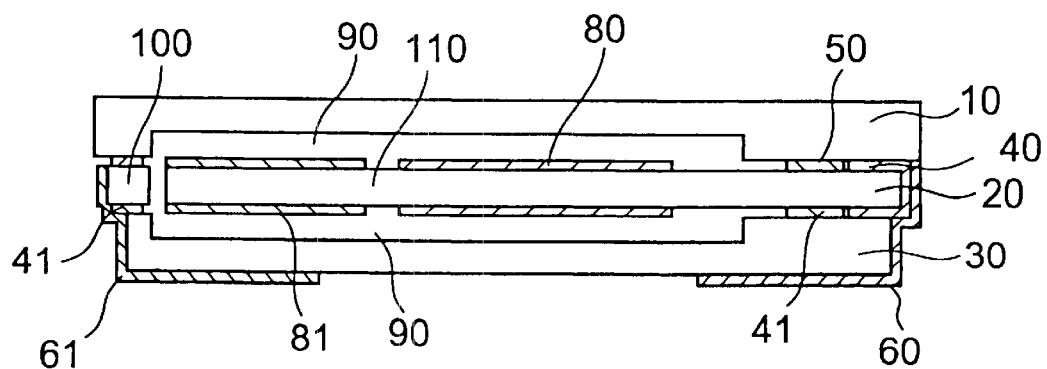
FIG. 3 is a sectional view of the piezoelectric vibrator according to the embodiment of the invention.

FIG. 1 is a disassembled perspective view of the invention, FIG. 2 is a top perspective view of the invention and FIG. 3 is a sectional view of a piezoelectric vibrator of the invention.

A piezoelectric vibrator of the embodiment is, for example, a quartz vibrator having a tuning fork type quartz vibrator piece 110 comprising quartz ($SiO_2$) and, as illustrated, provided with an vibrator 20 having the quartz vibrator piece 110 and a lid 10 and a base 30 constituting a pair of lids bonded to two faces of the vibrator 20 for sealing in air tight the quartz vibrator piece 110 in an oscillatable state. As shown by FIG. 1, FIG. 2 and FIG. 3, the vibrator 20 of the embodiment includes the tuning fork type quartz vibrator piece 110 and a frame-like portion 100 integrally connected to a base end portion of the quartz vibrator piece 110 for surrounding the quartz vibrator piece 110.

The lid 10 and the base 30 constituting the pair of cover members or lids, are formed by, for example, soda lime glass and are provided with recess portion cavities 90 to partition spaces to a degree of not hampering vibration of the quartz vibrator piece 110 respectively at regions in correspondence with the quart vibrator piece 110.

Further, the bond film 41 is extended to a surface of the vibrator 20 on an opposed side via a side face of an end portion of the frame-like portion 100 in the short side direction on the side of the base end portion of the quartz vibrator piece 110 of the vibrator 20, that is, via an inner wall face of the through hole 121 of the quartz wafer 130. Further, at least portions of the bond film 40 and the bond film 41 formed on the two faces of the vibrator 20 are formed to surround the recess portion cavities 90 of the lid 10 and the base 30 respectively at the two faces and, after bonding, inner portions of the cavities 90 of the recess portions are sealed in an air tight manner.

Further, by the bond films 40 and 41, the lid 10 and the base 30 are bonded to upper and lower faces of the vibrator 20 by so-to-speak anode bonding although a detailed description thereof will be given later.

Figure 4:
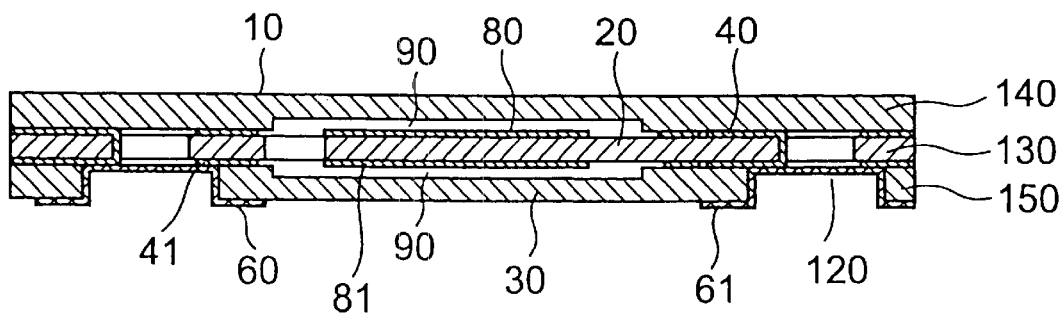
FIG. 4 is a sectional view of the piezoelectric vibrator formed on a wafer according to the embodiment of the invention.

In steps of fabricating the quartz vibrator according to the embodiment, pluralities of the vibrators 20, the lids 10 and the bases 30 are respectively formed on a wafer by etching by photolithography. As shown by FIG. 4, the vibrator 20 is formed with a plurality of the quarts vibrator pieces 110 on a single sheet of a quartz wafer 130 which is a first wafer. That is, a plurality of the vibrators 20 are integrally formed at the quartz wafer 130. Further, simultaneously therewith, through holes 121 are formed among the respective quartz vibrator pieces 110 in the longitudinal direction of the quartz vibrator piece 110, and inner faces of the through hole 121 constitute portions of side faces of the vibrators 20 after cutting the quartz wafer 130.

The lids 10 and the bases 30 are formed at glass wafers 140 and 150 comprising, for example, soda lime glass. Pluralities of the recess portion cavities 90 are formed on the wafers in correspondence with the respective quartz vibrator pieces 110 of the quartz wafer 130 by etching by photolithography. That is, there are integrally formed the plurality of lids 10 at the glass wafer 140 constituting a second wafer and the plurality of bases 30 at the glass wafer 150 constituting a third wafer. Further, simultaneously therewith, at portions of the glass wafer 150 in correspondence with the through holes 121 of the quartz wafer 130, there are formed through holes 120 larger than the through holes 121 of the quartz wafer 130 and inner faces of the through holes 120 formed at the glass wafer 150 constitute portions of side faces of the lids 10 and the bases 30 respectively after cutting the glass wafers 140 and 150.

Figure 5:
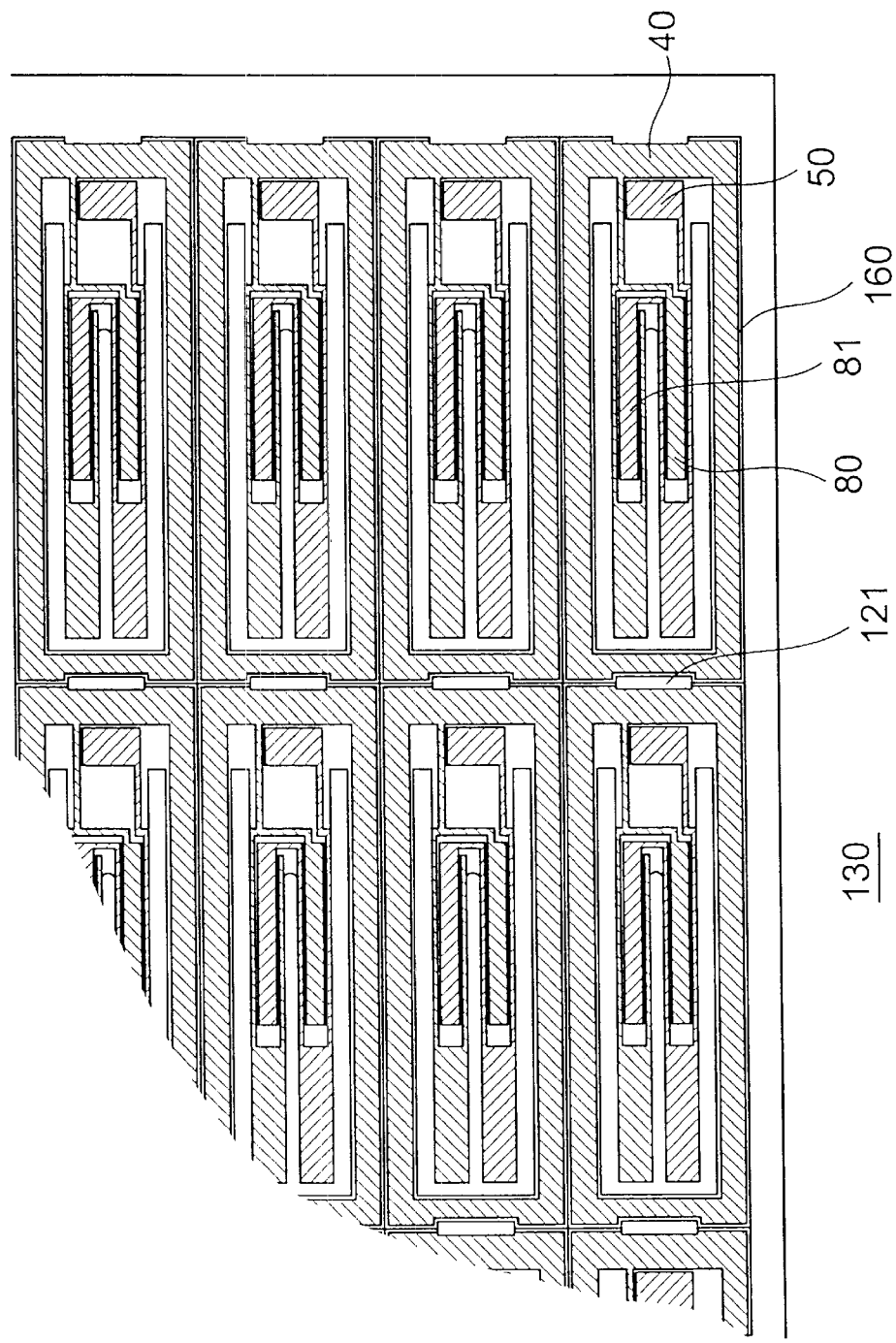
FIG. 5 is a outline view of a quartz wafer according to the embodiment of the invention.

As shown by FIG. 5, the upper and lower faces and the side faces of the quartz vibrator pieces 110 of the plurality of vibrators 20 formed on the quartz wafer 130, are formed with the excitation electrode films 80 and 81, the bond films 40 and 41 at the upper and lower faces of the frame-like portion 100, and extension electrodes 50 are formed at base end portions of the quartz vibrator pieces 110, by the same sputter film formed over an entire surface of the quartz wafer 130. Although as material of the sputter film, there is used Al, Cr or an alloy of these, in this embodiment, Al is used for forming thereof. By patterning the Al sputter film by photolithography, electrode patterns comprising electrodes of the excitation electrodes 80 and 81 and the extension electrodes 50 and the bond films 40 and 41 are formed on upper and lower faces of the respective vibrators 20.

The excitation electrode film 80 constituting one electrode is extended and connected to the bond film 40 and the excitation electrode 81 constituting other electrode is extended and connected to the bond film 41, respectively.

Further, the bond film 41 is extended to a surface of the vibrator 20 on an opposed side via a side face of an end portion of the frame-like portion 100 in the short side direction on the side of the base end portion of the quartz vibrator piece 110 of the vibrator 20, that is, via an inner wall face of the through hole 121 of the quartz wafer 130. Further, at lease portions of the bond film 40 and the bond film 41 formed on the two faces of the vibrator 20, are formed to surround the recess portion cavities 90 of the lid 10 and the base 30 respectively at the two faces and after bonding, inner portions of the cavities 90 of the recess portions are sealed in air tight.

At this stage, electrode patterns 160 of the respective vibrators 20 are independent from each other as shown by FIG. 5, characteristics of the vibrators can be adjusted by using the extension electrodes 50 constituting poles different from those of seal portions and the frequencies of the quartz vibrator pieces 110 are adjusted at this stage.

Figure 6:
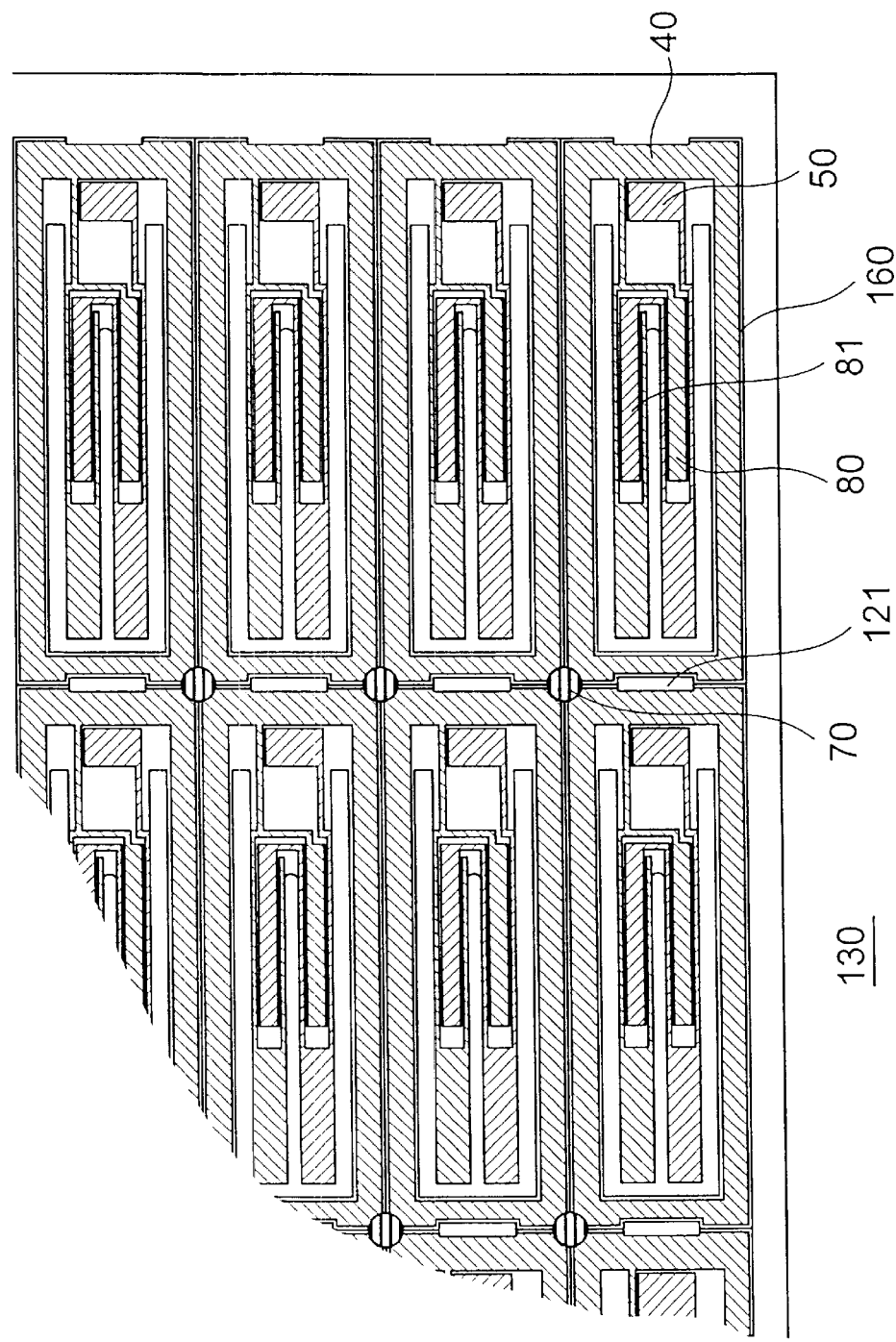
FIG. 6 is an outline view of the quartz wafer according to the embodiment of the invention after forming a sputter film for shortcircuiting.

Different from the related art, according to the invention, after forming respectives of the vibrators 20, the lids 10 and the bases 30 in the wafers, the three wafers are simultaneously bonded by the anode bonding. The bonding is carried out in high vacuum. However, it is difficult to supply electricity to all of the vibrators 20 sandwiched by the lids 10 and the bases 30 since the electrodes of the respective vibrators are independent from each other as describe above. Hence, according to the invention, after adjusting frequencies of the respectives of the plurality of quartz vibrator pieces 110 formed at the quartz wafer 130, by forming sputter films 70 for shortcircuiting of metal films, the bond films 40 and 41 in the individual electrode patterns 160 are connected to each other, thereby, electricity can be supplied to the bond films 40 and 41 of all the vibrators. Although according to the embodiment, as shown by FIG. 6, the sputter films 70 for shortcircuiting are formed to connect to each other corner portions of the respective electrode patterns 160, that is, corner portions of the bond films 40 and 41 on the frame-like portions 100, the invention is not limited thereto but the respective electrode patterns may be connected to each other.

Al is used for the sputter film 70 for shortcircuiting such that the sputter film 70 per se can be bonded and the film thickness is formed to be as thin as about 1000 A (Angstrom). A range of overlapping the bond films 40 and 41 at the corner portions of the electrode patterns 160 and the sputter films 70 for shortcircuiting, is set to a range of not hampering bonding the bond films 40 and 41 when the bond films 40 and 41 are used for the anode bonding and the films may be overlapped by each other by about 10 through 20 micrometers.

Figure 7:
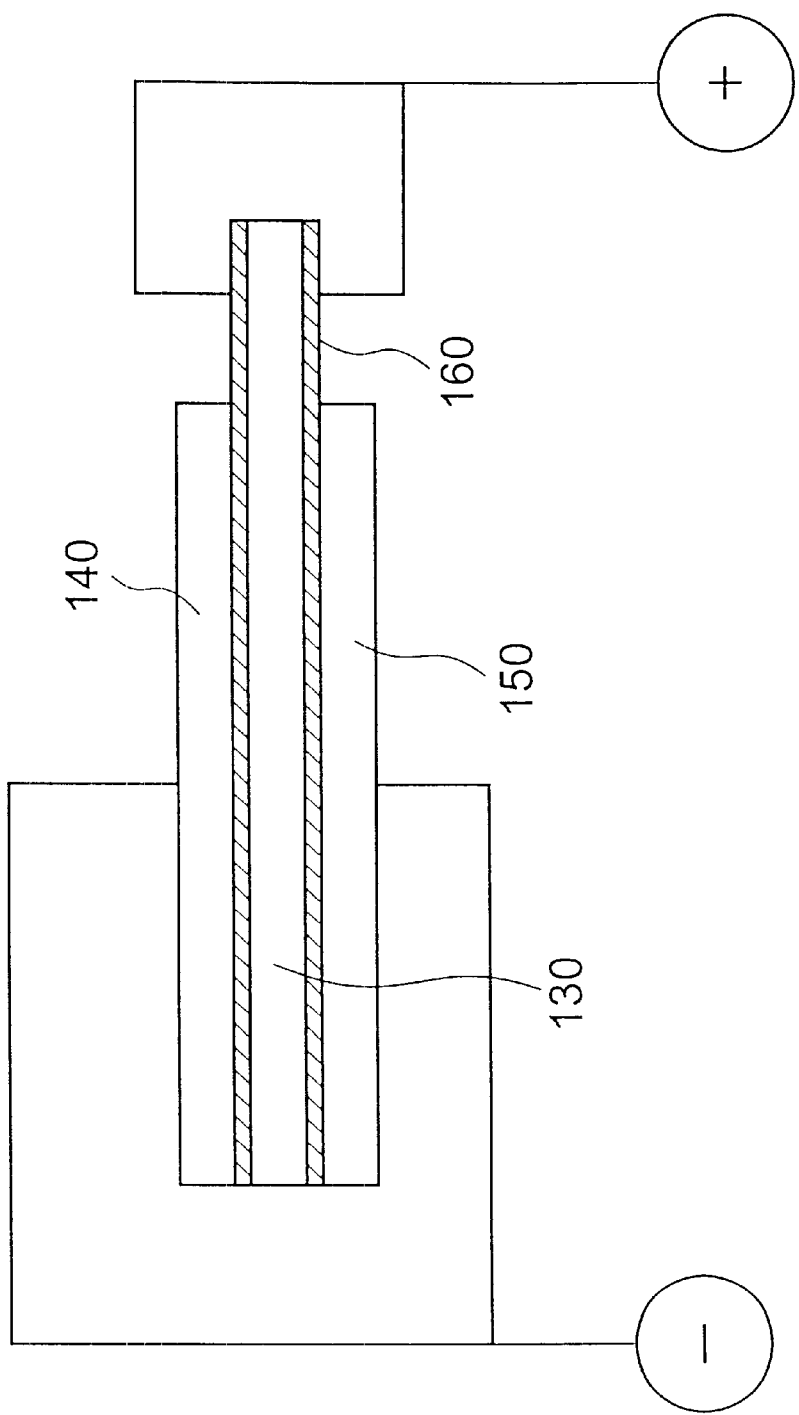
FIG. 7 shows constitution and arrangement in bonding the wafer according to the invention.

As shown by FIG. 7, in bonding the three wafers, the quartz wafer 130 formed with the vibrators 20, are sandwiched by the glass wafer 140 formed with the lids 10 and the glass wafer 150 formed with the bases 30 in vacuum, and the assembly is connected to a direct current power source such that the electrode patterns 160 comprising Al films of upper and lower faces of the quartz wafer 130 constituting the excitation electrodes 80 and 81 and the bond films 40 and 41 connected to each other by the sputter films 70 for shortcircuiting, constitute a positive pole and the glass wafer 140 and glass wafer 150 constitute a negative pole and three sheet of the wafers are simultaneously bonded by the anode bonding. At this occasion, by forming the sputter films 70 for shortcircuiting on the vibrators 20 and connecting the electrode patterns 160 thereto, there are connected all of the electrode patterns 160 from the bond films 40 and the bond films 41 to the upper and lower faces of the quartz wafer 130 and electricity can be supplied to all of the upper and lower faces. Therefore, the glass wafer 140 formed with the lids 10 and the glass wafer 150 formed with the bases 30 can simultaneously be bonded to the upper and lower faces of the quartz wafer 130 by the anode bonding. Although warp is caused in bonding by a difference between the thermal expansion coefficients of quartz and glass, by simultaneously bonding the glass wafers 140 and 150 to the both upper and lower faces of the quartz wafer 130, the problem of warping is resolved and a large area can be bonded with high productivity.

After finishing the bonding operation, there are formed extension electrodes 60 and 61 from side faces of end portions in the short side direction of the bases 30, that is, from inner wall faces of the through holes 121 of the glass wafer 150 to surfaces of the bases 30 via inner wall faces of the through holes 120, for example, by partially sputtering metal films comprising chromium (Cr) and gold (Au). The extension electrode 60 is provided be brought into contact with the bond film 40 and the extension electrode 61 is provided to be brought into contact with the bond film 41.

Further, by using technology of a dicing saw, the bonded wafers bonded and integrated with three sheets of the wafers, are mechanically cut at predetermined positions to thereby finish the individual quartz vibrators.

As has been explained above, according to the invention, there is prevented the problem of warp posed when the materials having different thermal expansion are used for the lids by the method of bonding under high temperature and applying voltage such as the anode bonding and large area can be bonded with high productivity.

What is claimed is:

1. A method of fabricating piezoelectric vibrators, comprising the steps of:
    forming a plurality of vibrators using a first wafer, each of the vibrators having a piezoelectric vibrator piece and a frame integrally connected to a base end portion of the piezoelectric vibrator piece and surrounding the piezoelectric vibrator piece;
    forming a plurality of electrode patterns each having a pair of excitation electrode films and bond films so that the pair of excitation electrode films is disposed on a respective one of the vibrators and the bond films are disposed on the frame of a respective one of the vibrators and are electrically connected to the pair of excitation electrode films;
    connecting the electrode patterns to one another using metal films;
    forming a plurality of lids using a second wafer, each of the lids being formed for sealing a respective one of the piezoelectric vibrator pieces without hampering vibration of the piezoelectric vibrator piece;
    forming a plurality of bases using a third wafer, each of the bases being formed for sealing a respective one of the piezoelectric vibrator pieces without hampering vibration of the piezoelectric vibrator piece;
    sandwiching the first wafer by the second wafer and the third wafer and simultaneously bonding the first, second and third wafers by anode bonding; and
    cutting the bonded first, second and third wafers to form a plurality of piezoelectric vibrators.

2. A method according to claim 1, wherein each of the lids is made of soda lime glass.

3. A method according to claim 1, wherein each of the bases is made of soda lime glass.

4. A method of fabricating a piezoelectric vibrator comprising:
    providing a piezoelectric oscillating plate having a piezoelectric vibrator piece and a frame integrally connected to a base end portion of the piezoelectric vibrator piece and surrounding the piezoelectric vibrator piece;
    disposing a pair of excitation electrodes on two side surfaces of the piezoelectric vibrator piece for vibrating the piezoelectric vibrator piece;
    forming bond films on upper and lower surfaces of the frame;
    connecting the bond films to the excitation electrodes;
    disposing shortcircuiting electrodes on the piezoelectric oscillating plate for causing a shortcircuit to electrically connect the bond films to each other; and
    covering the piezoelectric vibrator piece to seal the piezoelectric vibrator piece in an airtight manner via the bond films without hampering vibration of the piezoelectric vibrator piece.

5. A method according to claim 4; wherein the shortcircuiting electrodes comprise a plurality of sputter metal films.

6. A method according to claim 4; wherein each of the sputter metal films has a thickness of about 1000 Å.

7. A method according to claim 4; wherein the covering step comprises covering the piezoelectric vibrator piece by disposing a cover member on respective ones of the two side surfaces of the piezoelectric vibrator piece.

8. A method according to claim 7; wherein each of the cover members is made of soda lime glass.

9. A method of fabricating a piezoelectric vibrator, comprising the steps of:
    providing a vibrator having a piezoelectric vibrator piece and a frame connected to and surrounding the piezoelectric vibrator piece;
    disposing a pair of excitation electrodes on surfaces of two sides of the vibrator for vibrating the piezoelectric vibrator piece;
    forming bond films on the surfaces of the two sides of the vibrator;
    connecting the bond films to the excitation electrodes;
    anodically bonding each of a pair of cover members using a respective one of the bond films to a respective one of the surfaces of the two sides of the vibrator to seal the piezoelectric vibrator piece in an airtight manner without hampering vibration of the piezoelectric vibrator piece; and
    disposing a plurality of shortcircuiting films on the vibrator for shortcircuiting the bond films to each other.

10. A method according to claim 9; wherein each of the cover members is made of soda lime glass.

11. A method according to claim 9; wherein the shortcircuiting films comprise a plurality of sputter metal films.

12. A method according to claim 9; wherein the bond films and the excitation electrodes are made of the same material.

* * * * *